United States Patent [19]

Chang et al.

[11] Patent Number: 5,132,753
[45] Date of Patent: Jul. 21, 1992

[54] OPTIMIZATION OF BV AND RDS-ON BY GRADED DOPING IN LDD AND OTHER HIGH VOLTAGE ICS

[75] Inventors: Mike F. Chang, Cupertino; King Owyang, Atherton, both of Calif.

[73] Assignee: Siliconix incorporated, Santa Clara, Calif.

[21] Appl. No.: 498,170

[22] Filed: Mar. 23, 1990

[51] Int. Cl.⁵ .......................................... H01L 29/10
[52] U.S. Cl. ................................. 357/23.4; 357/23.8; 357/90
[58] Field of Search ................. 357/23.4, 90, 23.8, 357/23.4

[56] References Cited

U.S. PATENT DOCUMENTS 4,933,730 6/1990 Shirato ................................ 357/90

OTHER PUBLICATIONS

Bassous, E. et al., "Self-Aligned Polysilicon Gate MOSFET's with Tailored Source and Drain Profiles", IBM Technical Disclosure Bulletin, vol. 22 No. 11, Apr. 1980, pp. 5146–5147.

*Primary Examiner*—William Mintel
*Assistant Examiner*—Roy Potter
*Attorney, Agent, or Firm*—Skjerven, Morrill, MacPherson, Franklin & Friel

[57] ABSTRACT

Transistor structure using a lightly doped drain (LDD) technique are disclosed. The present invention provides a reduced on-resistance in the LDD region, while retaining substantially all the high breakdown voltage advantage of the LDD technique. The advantage of the present invention is achieved by applying a non-uniform impurity design in the LDD region, increasing gradually from the gate-edge towards the contact.

12 Claims, 3 Drawing Sheets

OPTIMIZATION OF BV AND RDS-ON BY GRADED DOPING IN LDD AND OTHER HIGH VOLTAGE ICS

FIELD OF THE INVENTION

This invention relates to the design of lightly doped drain (LDD) transistors and other high voltage integrated circuits.

BACKGROUND OF THE INVENTION

The LDD technique is widely used in high voltage field effect transistor applications to avoid breakdown due to the high electric field intensity at the gate-edge. This technique involves interposing a lightly doped drift region in the drain (LDD region), so as to reduce the electric field intensity to below the breakdown voltage (BV). The length of this LDD region is dependent upon the specific operating range of the transistor. However, in addition to a larger size in the resulting transistor, the drawbacks of an LDD device also include a larger turn-on drain resistance RDS-on), leading to a reduced current drive capability. In power applications, this LDD region needs to be very long, and hence a correspondingly high price is paid for the LDD advantage. In many cases, the RDS-on resistance dominates the total resistance in the device. Hence, the design of a transistor having a lesser on-resistance, but without reducing the breakdown voltage, is extremely valuable.

SUMMARY OF THE INVENTION

One object of the invention is to provide a reduced RDS-on transistor for high voltage applications, while maintaining the BV advantage of the LDD technique.

Another object is to provide a reduced RDS-on transistor so that the transistor can drive a higher current without increasing its width.

Another object is to provide an LDD device with the above advantages without increasing the device area.

Other objects of the invention, and advantages thereof, will become clear by reference to the detailed description and the accompanying drawings.

The foregoing objects can be achieved by providing an LDD field effect transistor with a non-uniform lightly doped drift region in the drain; the impurity concentration increases from the gate-edge to the contact.

BRIEF DESCRIPTION OF THE DRAWINGS

All sectional views are drawn with x, y directions indicated, viewing from the z direction.

DESCRIPTION OF THE PREFERRED EMBODIMENTS

In this description, n-MOSFETs are used for purpose of illustration The discussion will be understood by one skilled in the art to be equally applicable for p-MOSFETS. Because "drain" and "source" are defined only by current direction in operation, these terms are interchangeable in the following description.

Figure 1:
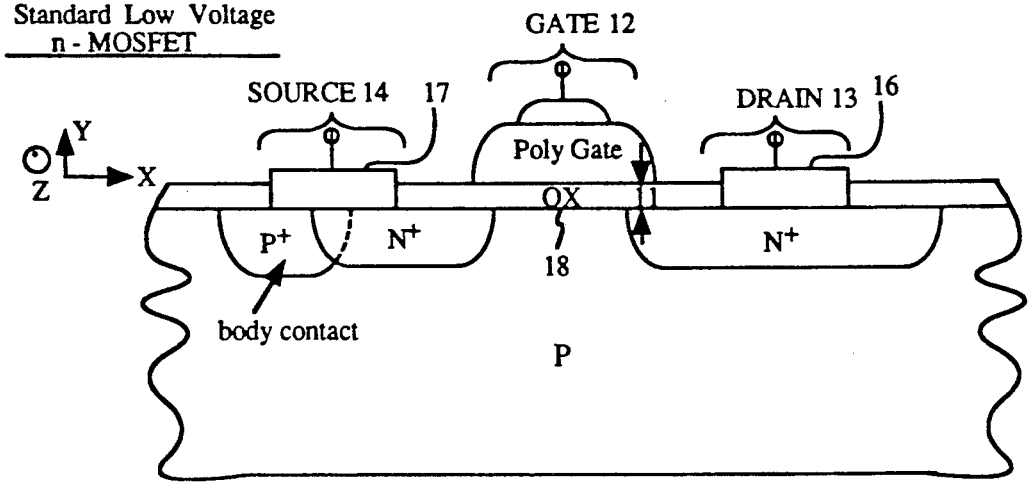
FIG. 1 is a sectional view of a typical low-voltage n-MOSFET device (PRIOR ART)
Figure 2:
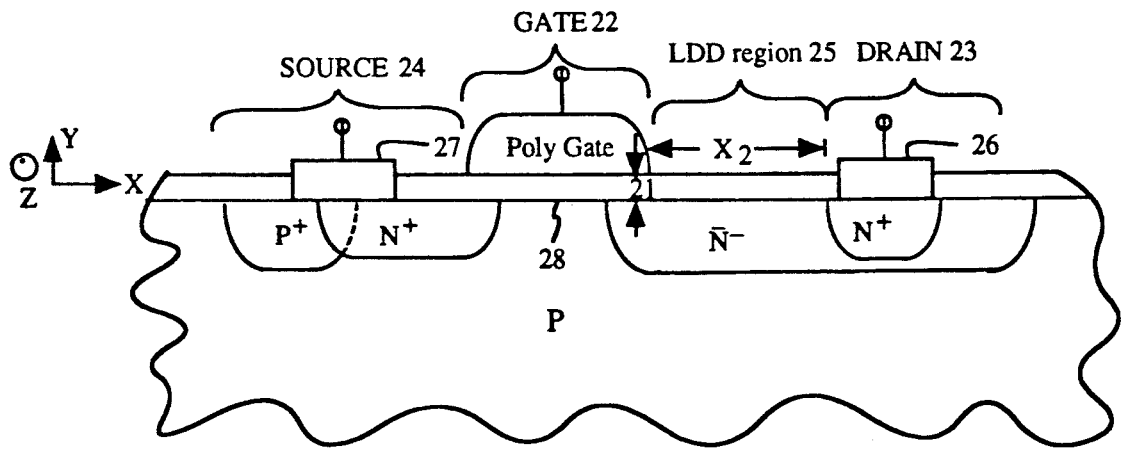
FIG. 2 is a sectional view of an LDD device in the prior art.

FIG. 1 shows a typical prior-art low-voltage n-MOSFET. Referring to FIG. 1, for higher voltage applications, the electric field at the edge region 11 of the gate 12 and drain 13 may become too high, to cause a breakdown of the oxide in this region 11. Therefore, in the prior art, as shown in FIG. 2, a lightly doped $N^-$ region 25 is interposed between the gate 22 and drain 23, so that the high voltage may drop over the distance X2.

Figure 3:
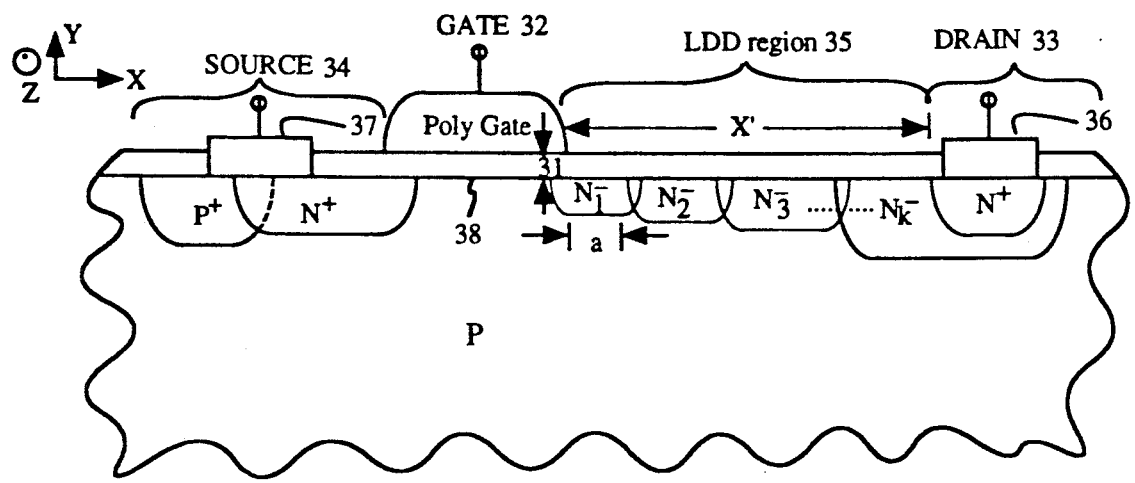
FIG. 3 is a sectional view of an LDD n-MOSFET device with graded doping profile in the lightly doped drift region.

FIG. 3 shows an embodiment of the present invention in an n-channel LDD device with a graded doping profile in the lightly doped drift region 35. The impurity concentration in the LDD region 35 of this field effect transistor is gradually increased from $N^-_1$ at the gate-edge 31 to $N^-_k$, over a number of steps k, at the drain contact 36. Typically, the impurity concentration in the LDD region $N^-_k$ immediately adjacent the drain 33 approaches the impurity concentration $N+$ in the drain region 33. In the prior art, as shown in FIG. 2, the LDD region 25 is usually given a uniform impurity concentration of $\overline{N}-$. In the embodiment shown in FIG. 3, according to the present invention, the typical values for $N^-_1$ and $N^-_k$ are $1 \times 10^{-12} CM^{-3}$ and $4 \times 10^{-12} CM^{-3}$ respectively. The typical value for $\overline{N}-$ is $1 \times 10^{-12} CM^{-3}$.

To further illustrate the present invention, a simplified resistance model is adopted. The on-resistance of an LDD region 25, as shown in FIG. 2, is roughly given by $$RDS\text{-on} = k \frac{L}{W} \frac{1}{Q}$$

where
- L, W are the physical length and width dimensions of the LDD region, the length is measured in the x direction and the width measured in the z direction;
- Q is the charge density as approximated by the impurity concentration;
- k is a proportionality constant.

Using this model, assuming that the LDD device of the present invention, as illustrated in FIG. 3, is implemented by four equally spaced steps of impurity concentration Q, 2Q, 3Q and 4Q each of length $\frac{1}{4}L$ in the x direction, and width w in the z direction, $$RDS\text{-on} = K\left(\frac{L}{4w}\right)\left[\frac{1}{Q} + \frac{1}{2Q} + \frac{1}{3Q} + \frac{1}{4Q}\right] = K\left(\frac{L}{w}\right)\left(\frac{25}{48Q}\right)$$

It is readily seen, by comparing to the prior device, such as shown in FIG. 2, having uniform impurity concentration Q, length L in the x direction, and having the same width w in the z direction $$RDS\text{-on} = K\left(\frac{L}{W}\right)\left(\frac{1}{Q}\right)$$

Therefore, in this example, the LDD device in the present invention in FIG. 3 has about a 50% improvement in RDS-on over the prior art device shown in FIG. 2, having the same physical dimensions. Since the exact dimensions and impurity concentration to use are determined by the desired BV and RDS-on characteristics, the values given here are for illustration purpose only. For a 500 V application, 60 μm is typical for L.

Figure 4:
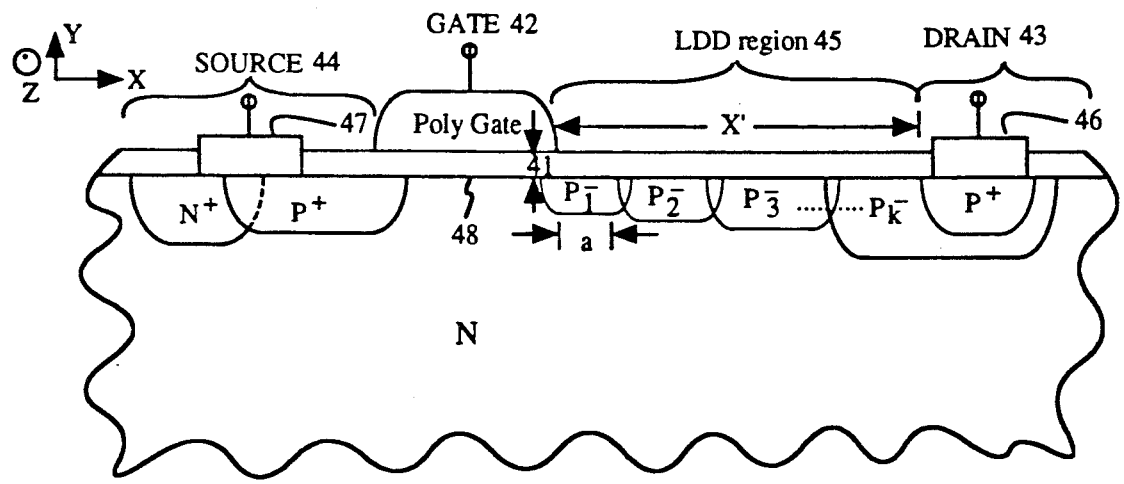
FIG. 4 is a sectional view of an LDD p-MOSFET device with a graded doping profile in the lightly doped drift region.

The application is not limited to n-channel field effect transistors. The same advantage can be attained in a p-channel field effect transistor, if the LDD region is doped with impurities creating a $p^{31}$ type semiconductor region. Therefore, an embodiment of the present invention implemented in a p-MOSFET is shown in FIG. 4.

Figure 5:
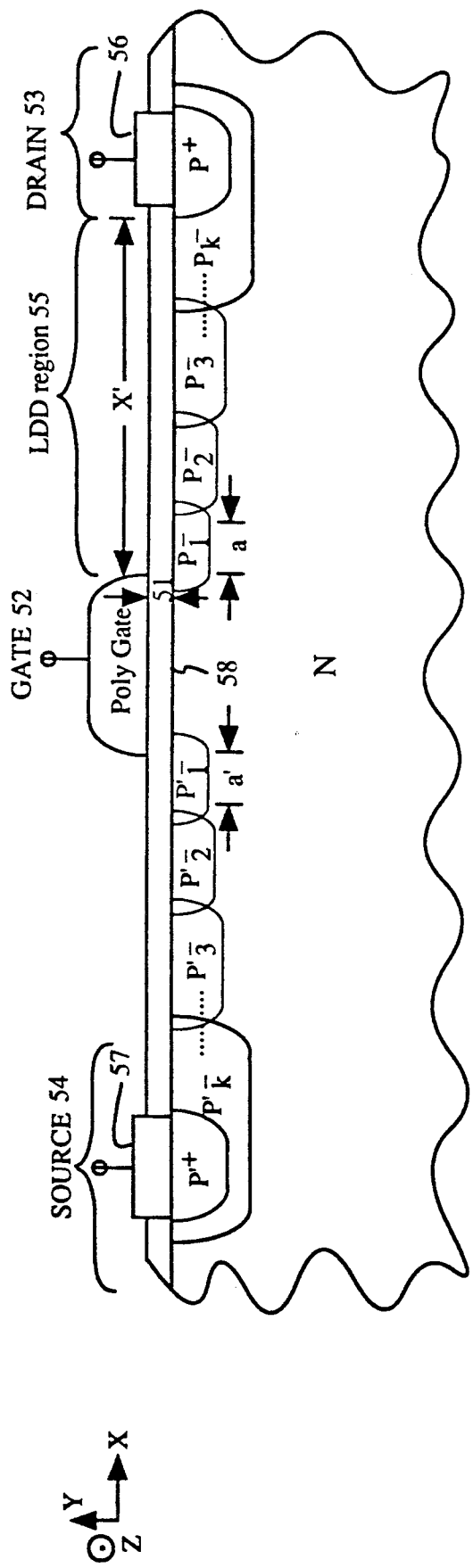
FIG. 5 is a sectional view of a bidirectional LDD p-MOSFET device with graded doping profiles in the lightly doped drift regions.

Another embodiment of the present invention is shown in FIG. 5 In this embodiment, LDD regions 55 and 55' are found on either sides of the gate 52, forming a bidirectional LDD transistor. Like the unidirectional LDD devices discussed above in conjunction with FIGS. 3 and 4, this bidirection LDD transistor in FIG. 5 also provides the high BV and low RDS-on resistance advantages. Furthermore, since this transistor in FIG. 5 is symmetrical about the gate 52, it may be connected without regard to current direction; thus, this device structure simplifies and facilitates interconnection in the physical layout. This transistor in FIG. 5 may also be used in an application where bi-directional current flow is desired, as in a transfer device.

There are many ways to create the graded doping profile in the LDD region. One method uses only one LDD implant mask. In this method, using the device in FIG. 3 as an example, the mask is drawn to create small perforations in the image corresponding to the lightly doped drift region 35, such that when a beam of dopant ions is cast on the mask, the density of the perforations in the implant mask will determine the amount of ions allowed through the mask, thereby determining the concentration of ions implanted in the LDD region on the semiconductor substrate. For this application, the density of the small perforations is lower at the gate-edge 31 and higher as one moves away from the channel region 38 towards the drain contact 36.

This invention may also be applied to other high voltage integrated circuit components requiring a large field drift region to sustain high voltage.

The invention is illustrated above by way of example only. It is understood that many modifications and variations are feasible within the scope of the present invention.

What is claimed is:

1. A field effect transistor, comprising:
   a substrate of a first conductivity type having a surface;
   a first source/drain region embedded in the surface of the substrate and of a second conductivity type, opposite to the first conductivity type;
   a second source/drain region embedded in the surface of the substrate, and separated from the first source/drain region, the second source/drain region being of the second conductivity type;
   a gate region above the surface of the substrate, separated from the surface by an insulator region;
   a channel region underneath said gate region, said channel region being of one of first and second channel types; and
   a lightly doped drift region between the channel region and the second source/drain region, the lightly doped region being of the second conductivity type, and having a graded impurity concentration generally increasing from an edge of the lightly doped drift region adjacent the channel towards an edge of the lightly doped drift region adjacent the second source/drain region, thereby substantially reducing on-resistance in said lightly doped drift region.

2. A field effect transistor as recited in claim 1, wherein the first conductivity type is n-type and the second conductivity type is p-type.

3. A field effect transistor as recited in claim 1, wherein the first conductivity type is p-type and the second conductivity type is n-type.

4. A field effect transistor as recited in claim 1, wherein the lightly doped drift region further comprises a plurality of subregions each having a different impurity concentration, the subregions located such that the most lightly doped subregion is closest to the edge of the lightly doped drift region adjacent the channel, and each successive subregion further distal from the channel and more proximal to the second source/drain region having successively higher impurity concentrations.

5. A field effect transistor as recited in claim 1, wherein the lightly doped drift region further comprises a plurality of subregions each having a uniform impurity concentration, the subregions located such that the average impurity concentration over subregions closer to the channel than the second source/drain region is less than the average impurity concentration of the subregions closer to the second source/drain region than the channel.

6. A field effect transistor, comprising:
   a substrate of a first conductivity type having a surface;
   a first source/drain region embedded in the surface of the substrate and of a second conductivity type, opposite to the first conductivity type;
   a second source/drain region embedded in the surface of the substrate, and separated from the first source/drain region, the second source/drain region being of the second conductivity type;
   a gate region above the surface of the substrate, separated from the surface by an insulator region;
   a channel region underneath said gate region, said channel region being of one of first and second channel types;
   a first lightly doped drift region between the channel region and the second source/drain region, the first lightly doped drift region being of the second conductivity type, and having a graded impurity concentration generally increasing from an edge of the first lightly doped drift region adjacent the channel towards an edge of the first lightly doped drift region adjacent the second source/drain region, thereby substantially reducing on-resistance in said first lightly doped drift region; and
   a second lightly doped drift region between the channel and the first source/drain region, the second lightly doped drift region being of the second conductivity type, and having a graded impurity concentration generally increasing from an edge of the second lightly doped drift region adjacent to the channel towards an edge of the second lightly doped drift region adjacent the first source/drain region, thereby substantially reducing on-resistance in said second lightly doped drift region.

7. A field effect transistor as recited in claim 6, wherein the first conductivity type is n-type and the second conductivity type is p-type.

8. A field effect transistor as recited in claim 6, wherein the first conductivity type is p-type and the second conductivity type is n-type.

9. A field effect transistor as recited in claim 6, wherein the first lightly doped drift region further comprises a plurality of subregions each having a different impurity concentration, the subregions located such that the most lightly doped subregion is closest to the edge of the first lightly doped drift region adjacent the channel, and each successive subregion further distal from the channel and more proximal to the second source/drain region having successively higher impurity concentrations.

10. A field effect transistor as recited in claim 6, wherein the second lightly doped drift region further comprises a plurality of subregions each having a different impurity concentration, the subregions located such that the most lightly doped subregion is closest to the edge of the second lightly doped drift region adjacent the channel, and each successive subregion further distal from the channel and more proximal to the first source/drain region having successively higher impurity concentrations.

11. A field effect transistor as recited in claim 5, wherein the first lightly doped drift region further comprises a plurality of subregions each having uniform impurity concentration, the subregions located such that the average impurity concentration over subregions closer to the channel than the first source/drain region is less than the average impurity concentration of the subregions closer to the first source/drain region than the channel.

12. A field effect transistor as recited in claim 5, wherein the second lightly doped drift region further comprises a plurality of subregions each having a uniform impurity concentration, the subregions located such that the average impurity concentration over subregions closer to the channel than the second source/drain region is less than the average impurity concentration of the subregions closer to the second source/drain region than the channel.

* * * * *

UNITED STATES PATENT AND TRADEMARK OFFICE
CERTIFICATE OF CORRECTION

PATENT NO.   :   5,132,753
DATED        :   July 21, 1992
INVENTOR(S)  :   Chang et al.

It is certified that error appears in the above-identified patent and that said Letters Patent is hereby corrected as shown below:

At column 2, line 32 delete "$1 \times 10^{-12}$ $CM^{-3}$" and substitute --$1 \times 10^{12}$ $CM^{-2}$--.

At column 2, line 32 delete "$4 \times 10^{-12}$ $CM^{-3}$ and substitute --$4 \times 10^{12}$ $CM^{-2}$--.

At column 2, line 34 delete "$10^{-12}$ $CM^{-3}$" and substitute --$10^{12}$ $CM^{-2}$--.

At column 3, line 17 delete "$P^{31}$" and substitute --p--.

Signed and Sealed this

Sixteenth Day of November, 1993

Attest:

BRUCE LEHMAN

*Attesting Officer*   *Commissioner of Patents and Trademarks*